(12) United States Patent
Weidinger et al.

(10) Patent No.: US 11,889,629 B2
(45) Date of Patent: Jan. 30, 2024

(54) COMPONENT CARRIER COMPRISING EMBEDDED MAGNET STACK

(71) Applicant: AT&S Austria Technologie & Systemtechnik Aktiengesellschaft, Leoben (AT)

(72) Inventors: Gerald Weidinger, Leoben (AT); Gerald Weis, Bruck an der Mur (AT); Ivan Salkovic, Zagreb (HR); Karl Kirchheimer, Leoben (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 120 days.

(21) Appl. No.: 15/929,349

(22) Filed: Apr. 28, 2020

(65) Prior Publication Data
US 2020/0359503 A1   Nov. 12, 2020

(30) Foreign Application Priority Data

May 6, 2019   (EP) .................................. 19172754

(51) Int. Cl.
*H05K 1/18* (2006.01)
*H01F 27/24* (2006.01)
*H01F 27/28* (2006.01)
*H01F 41/04* (2006.01)
*H05K 3/46* (2006.01)

(52) U.S. Cl.
CPC ............ *H05K 1/185* (2013.01); *H01F 27/24* (2013.01); *H01F 27/2804* (2013.01); *H01F 41/041* (2013.01); *H05K 1/181* (2013.01); *H05K 3/4644* (2013.01); *H01F 2027/2809* (2013.01); *H01F 2027/2819* (2013.01); *H05K 2201/1003* (2013.01)

(58) Field of Classification Search
CPC ........................................................ H05K 1/185
USPC ............................................................... 361/761
See application file for complete search history.

(56) References Cited

U.S. PATENT DOCUMENTS

| | | | |
|---|---|---|---|
| 5,479,695 A * | 1/1996 | Grader | H01F 41/16 336/200 |
| 7,318,269 B2 * | 1/2008 | Yoshida | G11B 5/1274 336/200 |
| 2005/0173532 A1 | 8/2005 | Hasebe et al. | |
| 2006/0154052 A1 | 7/2006 | Waffenschmidt et al. | |

(Continued)

FOREIGN PATENT DOCUMENTS

EP    3 439 438 A1    2/2019

OTHER PUBLICATIONS

Extended European Search Report in Application No. 19172754.4; dated Oct. 30, 2019; pp. 1-9; European Patent Office, 80298, Munich, Germany.

(Continued)

*Primary Examiner* — Stanley Tso
(74) *Attorney, Agent, or Firm* — Robert A. Blaha; Smith Tempel Blaha LLC (57) ABSTRACT

A component carrier includes a base material stack having at least one electrically conductive layer structure and/or at least one electrically insulating layer structure, and a magnet stack with a plurality of magnetic layers and at least one bonding layer, each of the at least one bonding layer bonding two respectively neighboured magnetic layers, wherein the magnet stack is embedded in the base material stack.

14 Claims, 3 Drawing Sheets

(56) References Cited

U.S. PATENT DOCUMENTS

| | | | |
|---|---|---|---|
| 2006/0198162 A1* | 9/2006 | Ishidu | H01L 33/60 |
| | | | 257/E33.072 |
| 2008/0078474 A1* | 4/2008 | Naito | H01F 1/15308 |
| | | | 148/304 |
| 2014/0239892 A1* | 8/2014 | Sawa | H01F 3/10 |
| | | | 320/108 |
| 2014/0347157 A1* | 11/2014 | Pulugurtha | H01F 27/306 |
| | | | 29/602.1 |
| 2017/0053874 A1 | 2/2017 | Renaud-Bezot | |
| 2018/0279517 A1 | 9/2018 | Jang et al. | |
| 2018/0315534 A1 | 11/2018 | Jang | |
| 2019/0045624 A1 | 2/2019 | Weidinger et al. | |
| 2020/0035396 A1* | 1/2020 | Weis | H05K 1/165 |
| 2020/0098504 A1* | 3/2020 | Shirai | H01F 27/245 |

OTHER PUBLICATIONS

Wurth Elektronik Radial Wireless Charging Transmitter Coil, Ferrite Core, 18A, 12mΩ, 100 Q Factor; available at https://uk.rs-online.com/web/p/wireless-charging-coils/9236306 as downloaded on Apr. 28, 2020.

Anker Wireless Charger, Qi-Certified Ultra-Slim Wireless . . . available at https://www.amazon.com/Anker-Qi-Certified-Ultra-Slim-Compatible-PowerPort/dp/B0756Z8X82/ref=sr_1_19?ie=UTF8&qid=1550048710&sr=8-19&keywords=wireless+charging+station as downloaded on Apr. 28, 2020.

* cited by examiner

COMPONENT CARRIER COMPRISING EMBEDDED MAGNET STACK

CROSS-REFERENCE TO RELATED APPLICATIONS

This application claims the benefit of the filing date of the European Patent Application No. 19 172 754.4, filed May 6, 2019, the disclosure of which is hereby incorporated herein by reference.

TECHNICAL FIELD

Embodiments of the invention relate to a method of manufacturing a hermetic package, and to a hermetic package.

BACKGROUND

In the context of growing product functionalities of component carriers equipped with one or more electronic components and increasing miniaturization of such components as well as a rising number of components to be mounted on or embedded in the component carriers such as printed-circuit boards, increasingly more powerful array-like components or packages having several components are being employed, which have a plurality of contacts or connections, with ever smaller spacing between these contacts. In particular, component carriers shall be mechanically robust and electrically reliable so as to be operable even under harsh conditions.

SUMMARY

There may be a need to efficiently provide a component carrier with magnetic functionality.

According to an exemplary embodiment of the invention, a component carrier is provided which comprises a (in particular laminated) base material stack comprising at least one electrically conductive layer structure and/or at least one electrically insulating layer structure, and a (in particular laminated or adhesively connected) magnet stack comprising a plurality of magnetic layers and at least one bonding layer in between, wherein each of the at least one bonding layer bonds two respectively neighbored magnetic layers, and wherein the magnet stack is embedded in the base material stack.

According to another exemplary embodiment of the invention, a method of manufacturing a component carrier is provided, wherein the method comprises providing a base material stack (in particular formed by laminating a plurality of layer structures of component carrier material) comprising at least one electrically conductive layer structure and/or at least one electrically insulating layer structure, and embedding a magnet stack in the base material stack, wherein the magnet stack comprises at least two magnetic layers and at least one bonding layer, each of the at least one bonding layer bonding two respectively neighbored magnetic layers.

According to yet another exemplary embodiment of the invention, a method includes the steps of forming a magnet stack as an alternating sequence of substantially planar magnetic layers and substantially planar dielectric bonding layers between each pair of adjacent magnetic layers, wherein the planar magnetic layers include a nanocrystalline magnetic material and each bonding layer is thermally stable at least up to 300° C., and inserting the magnetic stack as an inlay for embedding into a printed circuit board.

Overview of Embodiments

In the following, further exemplary embodiments of the methods and the component carrier will be explained.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "base material stack" may denote a flat body of substantially parallel aligned layer structures of component carrier material (for instance copper, resin and glass), wherein the layer structures are integrally connected with one another, for instance by lamination.

In the context of the present application, the term "magnet stack" may denote a body of substantially parallel aligned layer structures of magnetic material and adhesive material, wherein the layer structures are integrally connected with one another, for instance by adhesion or lamination.

In the context of the present application, the term "bonding layer" may denote an adhesive film capable of connecting two magnetic layers of the magnet stack by gluing or adhesion to thereby form a bonded stack of alternating magnetic and bonding layers.

In the context of the present application, the term "magnetic layer" may denote in particular any flat or planar physical body having magnetic properties capable of generating an attracting magnetic force with another (in particular cooperating, similar or identical) magnet layer. For instance, the magnet layer may have permanent magnetic properties (for instance may be ferromagnetic or ferrimagnetic) or may have paramagnetic properties. It is also possible that the magnet layer is magnetized triggered by an external signal, for instance may be an electromagnet (such as a coil, through which a current can flow) or a magnetic material being magnetizable by an external magnetic field. For instance, the magnet layers may comprise or consist of a 3d magnet (such as iron, nickel, cobalt) or a 4f magnet (such as neodymium, cerium, erbium, europium, gadolinium). The magnet layers may have different flat geometries, for instance may be round, rectangular, square shaped, triangular, etc. In particular, the side walls of the magnet layers may have a certain roughness to improve the adhesion with directly connected material of the component carrier.

According to an exemplary embodiment of the invention, a component carrier is provided which has embedded therein a multi-layer magnet stack composed of magnetic layers and one or more bonding layers. Layer-type magnetic layers can be manufactured with a high value of the magnetic permeability ($\mu_r$), but are difficult to manufacture with a large thickness without the risk of damage, since magnetic layers with high permeability may be very brittle. While thin magnetic layers with high magnetic permeability can be manufactured with sufficient mechanical stability, they may become brittle when excessively thick. However, it has turned out to be possible to interconnect a plurality of thin magnetic layers by one or more bonding layers which hold the various magnetic layers together. An obtained magnet stack may have both high magnetic permeability and sufficient magnetic volume as well as a sufficient mechanical stability which allows the magnet stack to be embedded in a base material stack of component carrier material. Surprisingly, such a magnet stack may also be capable of withstanding high temperatures as occurring during component carrier manufacture or processing.

A gist of an exemplary embodiment can be seen in the provision of a component carrier, such as a printed circuit board (PCB), which may be provided with embedded stacked magnetic core material. More specifically, it may be possible to stack nanocrystalline sheet material with a thermally stable adhesive, as bonding layer, to create reflow resistant inlays and to embed them into the inner layers of a (for instance PCB type) component carrier. In particular, nanocrystalline stack material can be embedded just below a coil structure (which may form part of the component carrier as well) to enable a desired magnetic application. For instance, further miniaturization of DC/DC converters and other magnet based electronic devices can be achieved by embedding a reflow resistant magnet stack into the inner layers of a PCB or other kind of component carrier. As an alternative to DC/DC converters, wireless charging transmitter and/or receiver units as well as inductors may be formed based on component carriers according to exemplary embodiments of the invention. Corresponding embedded magnetic stacks may contribute to go further with the miniaturization of power converters.

Nanocrystalline materials have very high magnetic permeability (for instance up to 1000000) which may make them suitable for a variety of potential applications. The material is usually quite thin (for instance 20 µm or less). However, such a magnetic material may be stacked to achieve higher power transfer rates. According to an exemplary embodiment, nanocrystalline magnetic sheets may be stacked by using epoxy bonding sheets to achieve a desired thickness of for example 300 µm. As the material is embedded into inner layers of a PCB or other component carrier, a temperature stable adhesive may be advantageously used to achieve reflow resistance of a component carrier. For instance, an inlay type magnet stack may be embedded into a component carrier based on a center core production method. Such a procedure can be used to create wireless charging transmitter and/or receiver units with PCB embedded magnetic sheet material as well as DC/DC converters (both isolated and non-isolated) with embedded inductor or transformer.

In an embodiment, the magnet stack comprises an alternating sequence of a plurality of magnetic layers and a plurality of dielectric bonding layers in between. For instance, the number of magnetic layers may be in a range between 2 and 20, in particular between 3 and 10. Correspondingly, the number of dielectric bonding layers may be in a range between 2 and 20, in particular between 3 and 10.

In an embodiment, the magnet stack may be an inlay. In the context of the present application, the term "inlay" may particularly denote a pre-manufactured member which can be inserted into a cavity or through hole of the stack of layer structures, forming the base material stack, as a whole. Thus, the inlay can be manufactured in accordance with the requirements of its function, independently of boundary conditions of component carrier manufacturing technology. While the magnet stack may be a separate inlay, it may be also advantageous in another embodiment that the magnet stack is additively formed within the base material stack. Portions of the base material stack which are not used for other tasks may thus be functionalized to form part of the embedded magnet stack.

In an embodiment, the at least one bonding layer is temperature-stable at reflow soldering temperatures. In particular, the at least one bonding layer may be temperature stable at least up to a temperature of 300° C. According to such a highly advantageous embodiment, further processing of the component carrier (for instance carrying out reflow soldering processes or the like) involving temperatures of up to 300° C. can be carried out without damaging the embedded magnet stack.

In an embodiment, the at least one bonding layer comprises or consists of epoxy resin. Such epoxy bonding sheets (in particular in combination with nanocrystalline type magnetic layers) have turned out to be capable of forming a magnet stack with sufficient mechanical stability to be embedded in a base material stack of a PCB. At the same time, such epoxy bonding sheets may be temperature stable at reflow temperatures of 300° C. or more which may occur during component carrier processing. Thus, the use of epoxy bonding sheets may make it possible to obtain a magnet stack being compatible with component carrier manufacturing conditions, in particular processing temperatures of up to 300° C. or more.

In particular, a bonding layer comprising epoxy resin may be free of reinforcing fibers, in particular free of reinforcing glass fibers. This provides the bonding layer with some degree of elasticity promoting the ability of the magnet stack to be embedded in the base material stack (in particular by lamination) without the risk of damage of the magnet stack. Descriptively speaking, the one or more bonding layers may glue the magnetic layers in between together.

In an embodiment, the magnetic layers are made of nanocrystalline magnetic material. Nanocrystalline alloys may be manufactured for example based on iron and silicon, and may comprise one or more further additives such as boron, niobium, copper, etc. Such a nanocrystalline magnetic material may be manufactured as a thin-film or ribbon. Nanocrystalline magnetic material may be initially in an amorphous phase and may then be crystallized by subsequent thermal treatment, for instance by tempering in an oven at a temperature range of for example 500° C. to 600° C. Nanocrystalline magnetic material may have a fine grained microstructure with grain sizes for instance in a range between 1 nm and 100 nm, in particular in a range between 5 nm and 30 nm, preferably in a range between 10 nm and 20 nm. Nanocrystalline magnetic material is highly appropriate for component carrier applications, but conventionally suffers from the problem that such a material may be highly brittle and can be produced with a mechanical stability sufficient for industrial high throughput applications only with the limited thickness (of for instance 20 µm). The brittle characteristics of the nanocrystalline magnetic material may result from a treatment of iron with silicon in an oven. However, it has turned out that connecting multiple of such nanocrystalline magnetic material sheets stacked parallel to one another and connected by dielectric bonding layers in between allows manufacturing a magnet stack which can be implemented (for instance as an inlay) with sufficient mechanical stability and highly advantageous magnetic properties in the component carrier. Descriptively speaking, by forming a compound between nanocrystalline magnetic layers and dielectric bonding layers (in particular made of a thermostable resin) in between, a significantly less brittle compound structure is obtained rendering the manufactured magnet stack less prone to failure during embedding and further processing of the component carrier.

In an embodiment, the magnetic layers comprise an iron-silicon compound. Although such magnetic layers are brittle and can thus be only manufactured with high mechanical stability with sufficiently small thickness, such materials have turned out to be usable for forming the magnet stack with the smoothening effect of the interleaved one more dielectric bonding layers.

In an embodiment, the magnetic layers have a magnetic permeability pr of at least 10000, in particular of at least 50000. For instance, a nanocrystalline magnetic material produced on the basis of iron and silicon may even have a magnetic permeability of 100000 or more.

In an embodiment, the component carrier comprises a coil structure coupled (in particular magnetically coupled) with the magnet stack. In the context of the present application, the term "coil structure" may particularly denote an at least partially electrically conductive structure, which may be composed of one or multiple connected electrically conductive elements, defining one or multiple windings. The windings may have a circular shape, a rectangular shape, any other polygonal shape, etc. For instance, patterned copper foils in combination with vertical through connections made of copper (for example copper filled laser vias) between and/or in resin layers (optionally comprising glass fibers) of the base material stack may be combined so as to form one or more windings in component carrier material. For instance, the coil structure comprises interconnected electrically conductive elements surrounded by a dielectric matrix. In particular, the electrically conductive elements may be made of copper. The dielectric matrix may for instance be prepreg or FR4. For instance, the coil structure comprises planar elements in planes being parallel to one or more planes of the at least one electrically insulating layer structure of the base material stack and comprise vertical elements connecting the planar elements and extending perpendicular to the planes of the planar elements. The planar elements may be embodied as patterned copper foils. The vertical elements may be copper filled laser vias, copper filled mechanically drilled vias, copper pillars, copper inlays, etc. Descriptively speaking, the one or more windings may be formed by the planar elements, whereas connections between adjacent windings may be formed by the vertical elements.

For instance, the magnet stack may form a magnetic core filling at least part of a coil opening of the coil structure.

In an embodiment, the coil structure is arranged as planar coil, in particular may be spirally formed. Such a planar foil may be formed on an outermost or on the two outermost electrically conductive layer structures of the base material stack. Such a planar and spiral configuration of the coil structure in one or two planes allows obtaining a highly compact configuration of the component carrier in a vertical direction.

Figure 7:
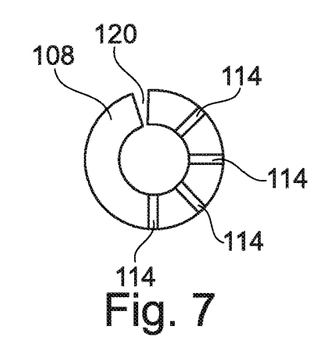
FIG. 7, FIG. 8, FIG. 9, FIG. 10 to FIG. 11 illustrate arrangements of magnet stacks and coil structures of component carriers according to other exemplary embodiments of the invention.

In another embodiment, the coil structure comprises a plurality of helical windings (compare FIG. 8 to FIG. 10) and/or a plurality of annular windings (compare FIG. 7). Such windings may be obtained by the combination of patterned metallic layers (such as patterned copper foils) and vertical through connections (such as copper filled laser vias) interconnected with the patterned metallic layers. Descriptively speaking, each patterned metallic layer may form a respective winding of the coil structure, whereas each vertical through connection may connect two adjacent windings with one another.

In an embodiment, the coil structure comprises or consists of copper. Advantageously, material of the one or more electrically conductive layer structures of the base material stack may be used for forming the core structure, partially or entirely. Additionally or alternatively, the coil structure may be formed partially or entirely as part of an inlay comprising as well the magnet stack.

In an embodiment, the coil structure comprises a single coil or a plurality of coils (for instance a plurality of interleaved coils). The configuration of the coil structure may therefore be adjusted in accordance with the requirements of a specific application.

In an embodiment, the component carrier comprises at least one surface mounted component. Such one or more surface mounted components may be electrically connected with the coil structure so as to contribute to the electronic function of the component carrier with embedded magnet stack. The one or more surface mounted components may be active and/or passive devices. For instance, such a surface mounted component may be a semiconductor chip which may act as a controller for the electronic functionality of the component carrier.

In an embodiment, the at least one surface mounted component is mounted on a main surface of the component carrier opposing another main surface at and/or in which the coil structure is formed. In such a configuration, the magnet stack being embedded in the base material stack may be sandwiched between the core structure on the one hand and the at least one surface mounted component on the other hand. This has the advantage that the electromagnetic field generated by the coil structure cooperating with the magnet stack is formed in a region remote from the one or more surface mounted components so that the created electromagnetic fields do not interfere in a highly disturbing manner with the functionality of the surface mounted component(s). Descriptively speaking, the described geometry suppresses the formation of strong stray fields. In order to further improve the failure robust operation of the one or more components, it is possible to provide an electromagnetic radiation shielding around at least part of the respective component. In an embodiment, said magnet stack or another magnet stack may contribute to the electromagnetic shielding of the one or more components. For instance, an electromagnetic radiation shielding cage made of metallic or magnetic material may be provided for partially or entirely surrounding the respective component.

In an embodiment, a thickness of a respective bonding layer is in a range between 1 μm and 20 μm. Hence, the dielectric bonding layer may be rendered very thin while still being capable of properly adhering adjacent magnetic layers together. By keeping the bonding layers thin, the magnetic performance of the magnet stack may be high and a compact configuration may be obtained.

In an embodiment, a thickness of a respective magnetic layer is in a range between 3 μm and 70 μm, in particular in a range between 10 μm and 50 μm. When the magnetic layers become significantly smaller, the magnetic performance of the magnet stack may be reduced. When the magnetic layers become significantly thicker, the mechanical integrity of the magnet stack may be deteriorated in view of the brittle properties of usable magnetic layers.

In an embodiment, an entire thickness of the magnet stack is in a range between 100 μm and 1 mm, in particular in a range between 200 μm and 500 μm. Thus, a vertically compact configuration may be obtained, in particular when embedding such a magnet stack in a cavity formed in the base material stack.

In an embodiment, the magnet stack is formed as an annulus. Such a ring or annulus may be continuous in a circumferential direction or may be interrupted circumferentially by one or more gaps, as will be described below.

In an embodiment, the component carrier comprises a dielectric disc inserted as an inlay in a central through hole of the annulus. For instance, a circular disk which may, for example, be made of FR4 material may be inserted as a readily manufactured member into the central through hole of the annular magnet stack so as to avoid excessive voids in an interior of the component carrier. This may improve mechanical integrity of the component carrier, may suppress warpage and may prevent excessive stress.

In an embodiment, at least part of dielectric material in contact with at least part of the magnetic layers has a thermal conductivity of at least 1 W/mK, in particular of at least 3 W/mK. Thus, a strongly heat removing dielectric material (for instance a thermal prepreg) may be provided selectively in an environment of the magnetic layers so as to promote heat removal from the magnetic material during operation of the component carrier. This may allow to avoid hot spots around the magnet stack, and may thus suppress thermal stress. For instance, such a strongly heat removing dielectric material may be inserted in one or more gaps of the magnet stack, as will be described in the following.

In such an embodiment, the magnet stack may have at least one gap, in particular a plurality of circumferentially distributed gaps, more particularly three gaps. For instance, the at least one gap is filled with resin or is an air gap. When a magnetic path defined by the magnet stack is opened by one or more non-magnetic gaps, a magnetic stray field may develop in the surrounding of the component carrier. This may be advantageous in certain applications in which it is desired that a magnetic field of sufficiently high strength is also present around the component carrier (for instance for a wireless charger allowing an electronic apparatus, such as a mobile phone, to be charged in the surrounding of the component carrier by an inductive coupling so that the magnetic stray fields charge the electronic apparatus).

In an embodiment, the magnet stack extends only along a sub-portion of the lateral and/or vertical extension of the base material stack. For instance, the magnet stack may be a substantially disc-shaped or cuboid body with smaller dimensions than corresponding dimensions of the base material stack.

In an embodiment, the method comprises forming the magnet stack by first forming a plurality of separate double sheets, each formed by connecting a respective magnetic layer with a respective bonding layer (in particular at a temperature below a curing temperature of the bonding layer), and thereafter connecting the plurality of double sheets with each other (in particular at a temperature at or above the curing temperature of the bonding layers). Optionally, the bonding layer may be covered with a removable protection layer on one main surface thereof before connecting the double sheets for obtaining the magnet stack. Such a protection layer may be removed prior to connecting all double sheets with each other. By keeping the double sheets below curing temperature of the bonding layer prior to connecting the double sheets for obtaining an integral magnet stack body, a particularly pronounced adhering force may be obtained in an interior of the multiple layer magnet stack.

In an embodiment, the component carrier forms at least one of the group consisting of a wireless charger (in particular for a mobile phone), an inductor, a transformer, or a power converter or an inverter.

In an embodiment, the component carrier is configured as a wireless charger for wirelessly charging an electronic apparatus. In such an embodiment, an electronic apparatus to be electrically charged with electric energy may be placed in an environment of the component carrier with the embedded magnet stack cooperating with a coil structure. A magnetic field created in an exterior of the component carrier can then be coupled into the electronic apparatus for wirelessly charging the electronic apparatus (for instance a mobile phone).

In the context of the present application, the term "inductor" may particularly denote a passive (in particular two-terminal) electrical component that is capable of storing energy in a magnetic field when electric current flows through the inductor. An inductor may comprise an electrically conductive wiring wound into a coil shape around a magnetic core.

In an embodiment, the component carrier is configured as a power converter or inverter, in particular as one of a DC/DC converter and a DC/AC converter. A DC/DC (or DC-to-DC) converter may be denoted as an electronic device or electromechanical device that converts a source of direct current (DC) from one voltage level to another. A DC/AC (or DC-to-AC) converter may be denoted as an electronic device or circuitry that changes direct current to alternating current (AC).

In an embodiment, the method comprises embedding the magnet stack in a cavity of the base material stack. Such a cavity may be a blind hole extending through only a part of the thickness of the base material stack and delimiting an accommodation volume at sidewalls and at a bottom. Formation of a cavity (i.e. a blind hole) in the base material stack (for instance in a central core thereof) or in a peripheral portion of the base material stack renders it possible to easily embed the magnet stack by simply placing it in the cavity. For instance, the cavity may be formed by mechanically drilling, laser processing, etching, etc. In a preferred embodiment, the method comprises forming the cavity by integrating a non-adhesive release structure in the base material stack, and removing a piece of the base material stack above the release structure to thereby obtain the cavity. The piece may be spatially delimited by the non-adhesive release structure and by a circumferential cutting line, which may be formed for instance by mechanically cutting or laser cutting. According to such a preferred embodiment, a release layer made of a material having non-adhesive properties with regard to surrounding component carrier material is firstly embedded in the base material stack. Secondly, a portion of the base material stack above the release layer can be removed by cutting a circumferential line from an exterior of the stack extending up to the release layer. This can for instance be accomplished by mechanically drilling or by laser drilling. Due to the non-adhesive properties of the release layer, the circumferentially separated piece of the base material stack above the release structure or layer can be subsequently simply be taken out of the base material stack, and a cavity may be obtained. The magnet stack may be subsequently simply placed inside the cavity for embedding.

In another embodiment, the method comprises embedding the magnet stack in a through-hole extending through the base material stack. In such an embodiment, the accommodation volume may extend through the entire base material stack. For inserting the magnet stack in the through hole, a bottom of the through hole may be temporarily closed by a temporary carrier such as an adhesive body, in particular an adhesive film or an adhesive tape.

In an embodiment, the component carrier comprises at least one component surface mounted on and/or embedded in the component carrier. For instance, such a component may be an active component or a passive component. Components capable of controlling current by means of another electrical signal may be denoted as active components (for instance semiconductor chips). Components incapable of controlling current by means of another electrical signal may be called passive devices. Resistors, capacitors, and diodes are examples for passive components. In particular, it is possible to accommodate one or more (in particular active and/or passive) components between the windings of the coil structure, more generally in an appropriate volume of the embedded inductor. Still more generally, the at least one component may be embedded in at least one of a group consisting of the base material stack, and the magnet stack.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier (for example a printed circuit board, a substrate, or an interposer) in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier comprises said base material stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of a group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

A substrate or interposer may comprise or consist of at least a layer of glass, silicon, ceramic and/or organic material (like resin). A substrate or interposer may also comprise a photo-imageable or dry-etchable organic material like epoxy-based build-up films or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin, more specifically FR-4 or FR-5), cyanate ester, polyphenylene derivate, glass (in particular glass fibers, glass-spheres, multi-layer glass, glass-like materials), prepreg material, photo-imageable dielectric material, polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Delaware, U.S.A. Reinforcing materials such as webs, fibers or spheres, for example made of glass (multilayer glass) may be used as well. Although prepreg, FR4, or epoxy-based build-up film or photo-imageable dielectrics are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of a group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminate-type component carrier. In such an embodiment, the component carrier is a compound of multiple layer structures which are stacked and connected together by applying a pressing force, if desired accompanied by heat.

The aspects defined above and further aspects of the invention are apparent from the examples of embodiment to be described hereinafter and are explained with reference to these examples of embodiment.

DETAILED DESCRIPTION OF EXEMPLARY EMBODIMENTS

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

According to an exemplary embodiment of the invention, a component carrier (in particular a printed circuit board, PCB) may be provided with one or more magnet stacks having an alternating sequence of magnetic layers and dielectric bonding layers in between the magnetic layers. For instance, the stacked magnetic layers being separated by the bonding layers in between may function as magnetic core material of a coil structure. For example, the magnetic layers may comprise magnetic nanoparticles. One or more magnet stacks may be embedded in a base material stack (which may be composed of FR4 and copper) of the component carrier. A correspondingly obtained magnet stack may be embedded below coil layers in the base material stack of the component carrier. Such an architecture is highly flexible and compatible with many different component carrier designs, for instance for printed circuit boards having a number of electrically conductive layers in a range from two to eight.

Figure 1:
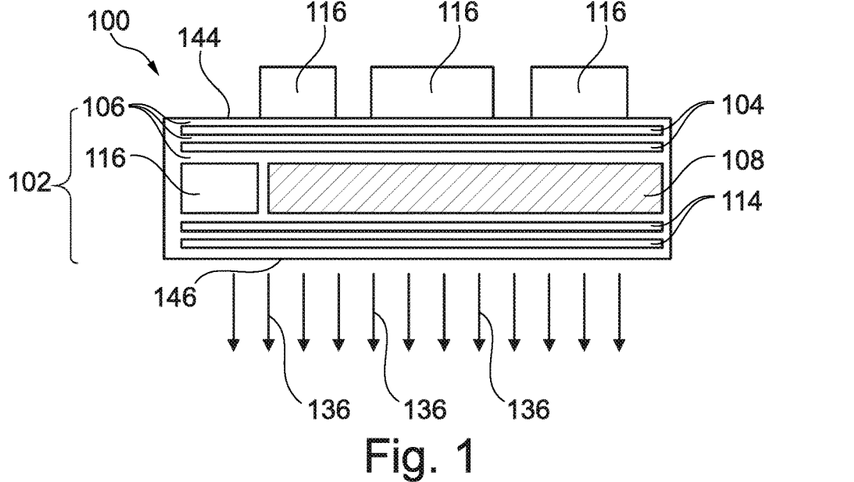
FIG. 1 illustrates a cross-sectional view of a component carrier with an embedded magnet stack according to an exemplary embodiment of the invention.
Figure 2:
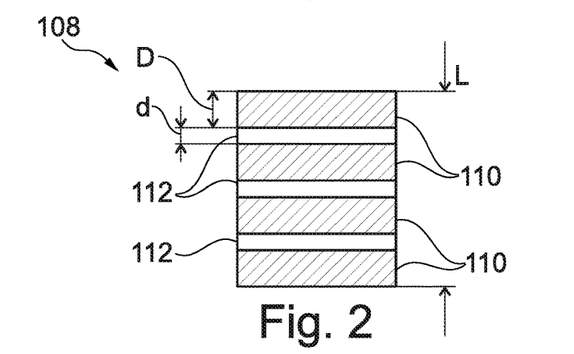
FIG. 2 illustrates a cross-sectional view of a magnet stack of a component carrier according to an exemplary embodiment of the invention.

FIG. 1 illustrates a cross-sectional view of a component carrier 100 with an embedded magnet stack 108 according to an exemplary embodiment of the invention. FIG. 2 illustrates a cross-sectional view of the magnet stack 108 of the component carrier 100 according to FIG. 1. However, the inlay type magnet stack 108 shown in FIG. 2 may also be used for other applications.

The component carrier 100 is here embodied as a printed circuit board (PCB). The component carrier 100 comprises a laminated base material stack 102 composed of electrically conductive layer structures 104 and electrically insulating layer structures 106. For example, the electrically conductive layer structures 104 may comprise patterned copper foils and vertical through connections, for example copper filled laser vias. The electrically insulating layer structures 106 may comprise a resin (such as epoxy resin), optionally comprising reinforcing particles therein (for instance glass fibers or glass spheres). For instance, the electrically insulating layer structures 106 may be made of prepreg or FR4. The layer structures 104, 106 may be connected by lamination, i.e. the application of pressure and/or heat.

Furthermore, the component carrier 100 comprises an inlay type magnet stack 108 embedded in a cavity of the base material stack 102. As shown in FIG. 1, the magnet stack 108 is embedded as a whole in the base material stack 102 and is thus implemented as an inlay being readily manufactured at the time of its embedding. Consequently, the magnet stack 108 has a smaller lateral extension than the base material stack 102 and therefore extends only along a sub-portion of the lateral or horizontal extension of the base material stack 102. Moreover, the magnet stack 108 has a smaller vertical extension than the base material stack 102 and therefore extends only along a sub-portion of the vertical extension of the base material stack 102.

Referring to FIG. 2, the magnet stack 108 comprises an alternating sequence of a plurality of magnetic layers 110 and a plurality of dielectric bonding layers 112. The magnetic layers 110 and the bonding layers 112 are arranged parallel to one another and alternatingly along a vertical direction, so that each of the bonding layers 112 bonds two respectively neighbored magnetic layers 110 at one of two opposing main surfaces of the respective bonding layer 112. As shown in FIG. 2 as well, a thickness, d, of a respective one of the bonding layers 112 may be for example in a range between 1 μm and 20 μm, for instance 5 μm. A sufficiently small thickness, d, of the bonding layers 112 ensures that the magnetic performance of the magnet stack 108 is high. A thickness, D, of the magnetic layers 110 may be in a range between 10 μm and 50 μm, for instance 20 μm. This ensures a high magnetic performance of the magnet stack 108 as a whole, while simultaneously preventing damage of the brittle material of the magnetic layers 110 which may become unstable at higher thicknesses. An entire thickness, L, of the magnet stack 108 may be for example in a range between 200 μm and 500 μm, for instance 300 μm.

The bonding layers 112 are made of an epoxy material (preferably without glass fibers) which is temperature-stable at least up to a temperature of 300° C. Thus, the material of the bonding layers 112 is reflow stable. This allows embedding the magnet stack 108 in the base material stack 102 without the risk of damage of the magnet stack 108 during further processing or operation of the component carrier 100. The magnetic layers 110 are made of nanocrystalline magnetic material and may comprise an iron-silicon compound having a very high magnetic permeability of for instance more than 50000. Although being quite brittle, the material of the magnetic layers 110 is mechanically stable in the stack compound of the magnet stack 108 thanks to the presence of the bonding layers 112, providing some degree of elasticity.

As can be taken from FIG. 1, the component carrier 100 moreover comprises a coil structure 114 being magnetically coupled with the magnet stack 108 and forming a coil with multiple windings cooperating with the magnet stack 108. In particular, the coil structure 114 may be substantially helically wound and may be formed of copper material of the electrically conductive layer structures 104 of the base material stack 102. Since the magnet stack 108 is embedded in an interior of the base material stack 102 with electrically conductive layer structures 104 on both opposing main surfaces thereof, the configuration of FIG. 1 is highly compact.

FIG. 1 also shows that the component carrier 100 comprises a plurality of surface mounted components 116, for instance embodied as active devices such as semiconductor chips and/or passive devices such as capacitors. Advantageously, the surface mounted components 116 are mounted on an upper main surface 144 of the base material stack 102 opposing a lower main surface 146 of the base material stack 102 in which the coil structure 114 is formed. In other words, the magnet stack 108 is arranged vertically in between the surface mounted components 116 on the one hand and the coil structure 114 on the other hand. Thus, the surface mounted components 116 do not disturb a wireless charging performance of the component carrier 100 (compare FIG. 3 to FIG. 5).

As can be taken from FIG. 1 as well, it is also possible to embed one or more further components 116 in the base material stack 102. In the shown example, one embedded component 116 is arranged side-by-side with and at the same vertical level as the magnet stack 108 to thereby contribute as well to the compact configuration of the component carrier 100. Preferably, the vertical thickness of the embedded component 116 may be the same as the vertical thickness, D, of the magnet stack 108. Such a thickness adaptation may be achieved by correspondingly selecting a number of magnet layers 110 and bonding layers 112 of the magnet stack 100, as shown in FIG. 2.

The surface mounted and embedded components 116 may be electrically connected to the coil structure 114.

As already mentioned, the component carrier 100 forms a wireless charger for a mobile phone. In other embodiments, a corresponding component carrier 100 may function as an inductor, a transformer, a DC/DC converter, etc.

What concerns wireless charging, a high coupling ratio between a transmitter and a receiver may be advantageous.

The height increase due to the coil structure 114 of the shown wireless charger may be reduced by embedding also the coil structure 114 in base material stack 102. According to the shown embodiment, the magnet stack 108 made of bonded high permeability magnetic layers 110 (for instance nanocrystalline magnetic sheets) may be embedded inside the PCB or other kind of component carrier 100 forming the core of the magnet stack 108. Windings of the coil structure 114 may be formed as a copper structure within the component carrier 100, i.e. may be formed as part of the electrically conductive layer structures 104 of the base material stack 102. Additional components 116, which may for instance be used for communication and/or power transfer, can be mounted as surface mounted device (SMD) components on top and/or bottom of the component carrier 100 and/or can be embedded in the component carrier 100.

Again, referring in particular to FIG. 1 and FIG. 2 (but also more generally also to other embodiments of the invention), the nanocrystalline materials of the magnetic layers 110 may have very high permeability (up to 1000000) which makes them highly appropriate for a variety of magnetic applications. However, such a material is usually quite thin (for instance with a thickness of 20 μm or less), since it may otherwise be prone to damage due to its brittle characteristics. According to an exemplary embodiment, such magnetic layers 110 may be stacked together with adhesive bonding layers 112 in between to achieve higher power transfer rates. Thus, nanocrystalline magnetic layers 110 may be stacked by using (for instance epoxy-based) bonding sheets or bonding layers 112 to achieve a desired thickness of for example 300 μm. Such a method of stacking magnetic layers 110 together with bonding layers 112 can be applied, for example, from two layers above. As the magnet stack 108 may be embedded into the inner layers of the PCB type component carrier 100, a temperature stable adhesive may be advantageously used for the sheet shaped bonding layers 112 to achieve reflow resistance in the final component carrier 100.

Advantageously, epoxy resin in the form of the bonding layers 112 may be applied to stack the magnetic layers 110 together. Instead of epoxy resin, another reflow resistant polymer can be used for the bonding layers 112. Preferably, such a bonding material may be temperature stable at least up to 300° C. Apart from such a sheet application, it is also possible to apply the adhesive material of the bonding layer(s) 112 in liquid form.

Using an adhesive material for the one or more bonding layers 112 having reflow stability has the advantage that it is not necessary to glue a magnet stack 108 as a surface mounted device on a component carrier 100, which would increase the thickness of the component carrier 100. In contrast to this, embedding magnet stack 108 in a preformed cavity of the base material stack 102 of the component carrier 100 may result in a compact component carrier 100. In contrast to a conventional approach of gluing patches of magnetic material to a backside of a PCB after assembly, the distance to coil structure 114 may thus be made smaller. As a result, a more compact component carrier 100 may be obtained. Thus, it may be possible according to an exemplary embodiment of the invention to embed magnet stack 108 in a PCB directly above or below coil structure 114 so as to obtain a compact configuration. Consequently, an assembly process may be improved and thick and heavy component carriers may be avoided by exemplary embodiments.

Thus, a highly advantageous aspect of an exemplary embodiment of the invention is the stacking of nanocrystalline sheet material in form of magnet layers 112 with one more bonding layers 110 made of a thermally stable adhesive to create a reflow resistant inlay which may then be embedded into the inner layers of PCB type component carrier 100.

Such a nanocrystalline magnet stack 108 can be embedded just next to coil structure 114 to create sophisticated electronic functions while keeping the compactness of the component carrier 100 high. As a result, a further miniaturization of magnetic applications in a component carrier 100 (such as the realization of a DC/DC converter) can be achieved by embedding a reflow resistant magnet stack 108 in inner layers of a base material stack 102 of a component carrier 100.

A corresponding process of producing the component carrier 100 may be as follows. For the stacking of the layers 110, 112 of the magnet stack 108, adhesive sheets with a carrier film may be used as one or more bonding layers 112. For instance, it may be possible to first laminate material at a lower temperature onto the nanocrystalline material of the magnetic layers 110 without curing the adhesive material of the one or more bonding layers 112. Then, the carrier film may be removed. A stack of coated sheets may then be laminated at full curing temperature to yield a preform of the magnet stack 108. Pieces of desired shapes can then be cut out of the laminated magnet stack 108, for instance with a laser machine. Correspondingly obtained inlay type magnet stacks 108 may then be embedded into a PCB material type base material stack 102, for instance by using a center core production method.

In an embodiment, the inlay type magnet stack 108 may remain electrically unconnected to any other copper structure of the component carrier 100. The procedure can be used to create a wireless-charging transmitter and/or receiver units with PCB embedded magnetic material as well as DC/DC converters (both isolated and non-isolated) with an embedded inductor or transformer.

What concerns the wireless charging function of the component carrier 100, applying an electric current to the coil structure 114 generates an electromagnetic field in the environment of the component carrier 100. The magnet stack 108 with the magnetic layers 112 of very high magnetic permeability enhances the electromagnetic field. In FIG. 1, the electromagnetic field is indicated schematically by arrows 136. When a mobile phone or other electronic device to be charged in a wireless manner is positioned in the region where the arrows 136 are shown and when such an electronic device comprises a corresponding receiver unit, the electromagnetic field generated by the component carrier 100 may be used for charging the electronic device.

Figure 3:
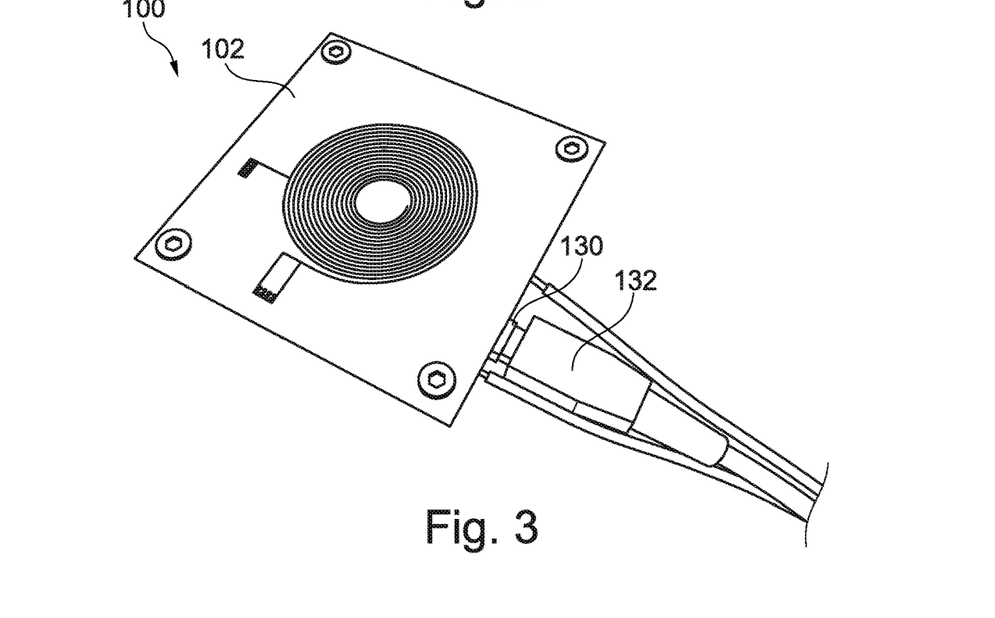
FIG. 3 illustrates a three-dimensional top view of a component carrier configured as wireless charging device according to an exemplary embodiment of the invention.
Figure 4:
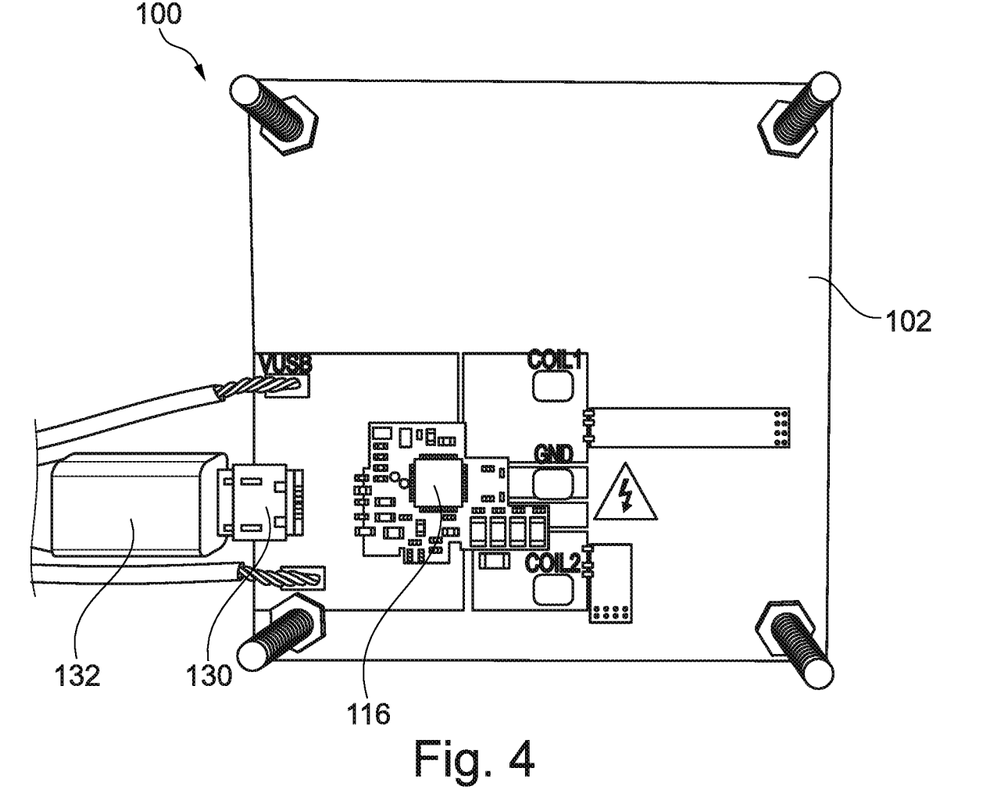
FIG. 4 illustrates a three-dimensional bottom view of the component carrier configured as wireless charging device according to FIG. 3.
Figure 5:
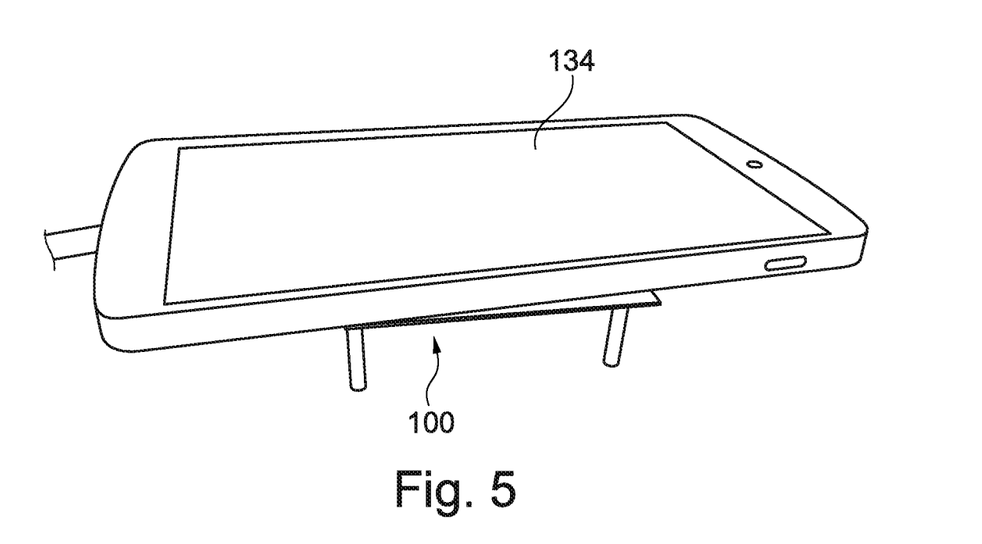
FIG. 5 illustrates a three-dimensional view of the component carrier configured as wireless charging device according to FIG. 3 and FIG. 4 with a mobile phone to be charged thereon in a wireless manner.

FIG. 3 illustrates a three-dimensional top view of a component carrier 100 configured as wireless charging device according to an exemplary embodiment of the invention. FIG. 4 illustrates a three-dimensional bottom view of the component carrier 100 configured as wireless charging device according to FIG. 3. FIG. 5 illustrates a three-dimensional view of the component carrier 100 configured as a wireless charging device according to FIG. 3 and FIG. 4 with a mobile phone as an electronic device 134 to be charged thereon. The component carrier 100 is connected via a plug 130 with a USB connector 132 to be supplied with electric current.

Figure 6:
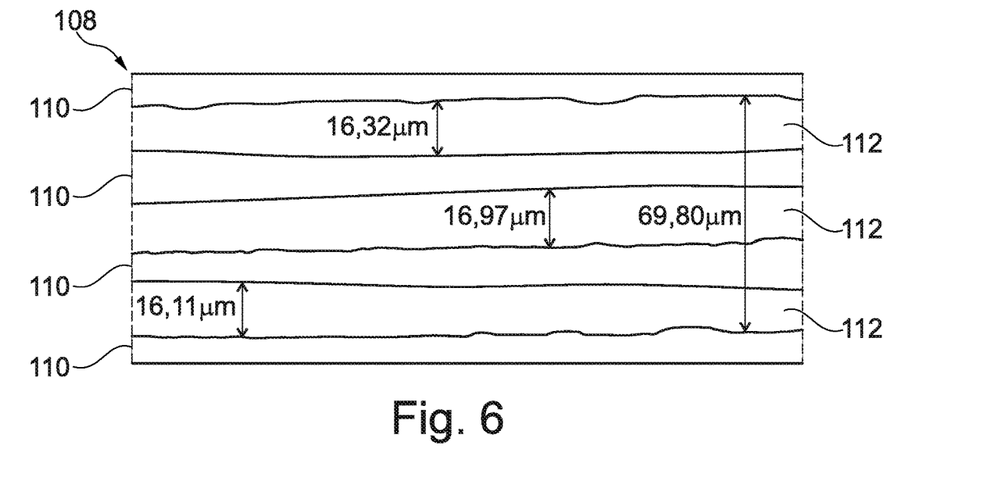
FIG. 6 illustrates an image showing a cross-sectional view of a magnet stack to be embedded in a component carrier according to an exemplary embodiment of the invention.

FIG. 6 illustrates an image showing a cross-sectional view of a magnet stack 108 to be embedded in a component carrier 100 according to an exemplary embodiment of the invention. FIG. 6 shows that the various layers 110, 112 have a homogeneous thickness and well-defined properties.

FIG. 7 to FIG. 11 illustrate arrangements of magnet stacks 108 and coil structures 114 of component carriers 100 according to other exemplary embodiments of the invention. The shown magnet stacks 108 correspond to different inductor configurations.

Referring to FIG. 7, the magnet stack 108 is formed as an annulus with a gap 120. The annulus is surrounded by windings of an annular coil structure 114. The gap 120 may be filled with resin (for instance of one of the electrically insulating layer structures 106) or is an air gap, i.e. remains unfilled. The gap design may allow fine tuning of the magnetic properties of the corresponding component carrier 100.

Figures 8, 9:
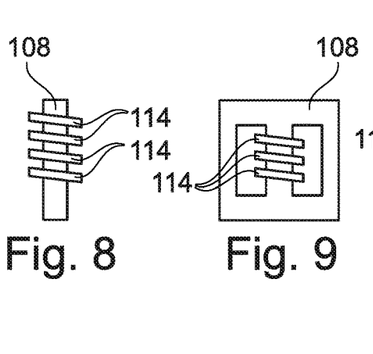

Referring to FIG. 8, the magnet stack 100 is formed as a pillar surrounded by the windings of the coil structure 114.

Referring to FIG. 9, the magnet stack 100 is shaped as a double rectangle, wherein the coil structure 114 surrounds a central post of the magnet stack 100. Two lateral posts of the magnet stack 100 are not surrounded by windings of coil structure 114.

Figure 10:
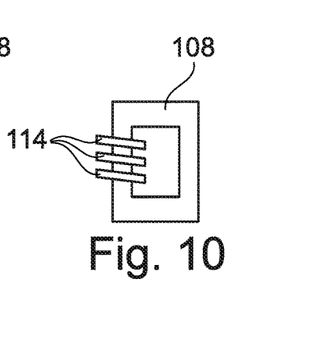

Referring to FIG. 10, the magnet stack 100 is shaped as a rectangle, wherein the coil structure 114 surrounds one post of the magnet stack 100, whereas another post of the magnet stack 100 is not surrounded by windings of coil structure 114.

Figure 11:
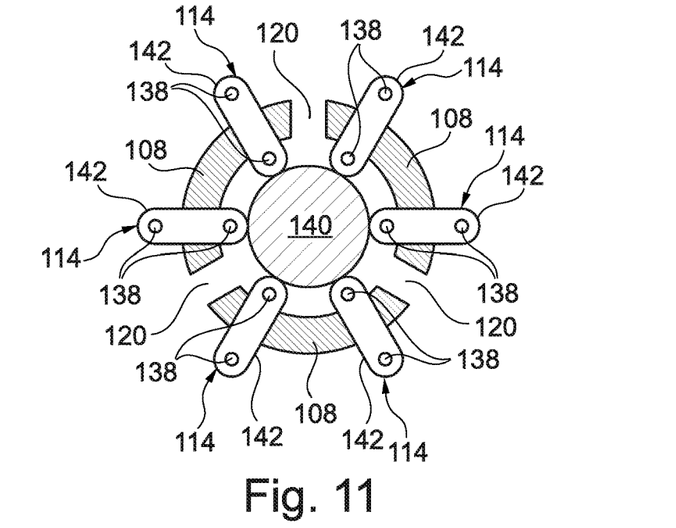

FIG. 11 illustrates an embodiment having an annular magnet stack 108 composed of three arcuate sections separated by three circumferentially arranged gaps 120. FIG. 11 also illustrates a coil structure 114 composed of substantially planar electrically conductive structures 142 (preferably made of copper) being interconnected by vertical through connections 138 (such as copper filled laser vias).

Providing the magnet stack 108 from multiple separate bodies (three in the example of FIG. 11) may simplify handling and assembly during the manufacturing procedure.

Number, arrangement and shape of the gaps 120 are design parameters for configuring the component carrier 100, for instance in terms of electromagnetic compatibility (EMC) behavior. The gaps 120 can be air gaps (i.e. may be void regions) or can be filled with a solid material (for instance can be filled with FR4 material or a high electric and/or magnetic permeability material), depending on the requirements of a certain application. For instance, thermal prepreg material with a thermal conductivity of at least 3 W/mK can be inserted into the gaps 120 for promoting heat removal during operation of the component carrier 100.

As shown, a dielectric disc 140 (for instance an FR4 inlay) may be placed in the central through hole of the substantially annular magnet stack 108. By taking this measure, excessive voids may be avoided within the component carrier 100. This may reduce warpage and mechanical stress of the component carrier 100.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   a base material stack having electrically conductive layer structures and at least one electrically insulating layer structure;

a magnet stack having a plurality of magnetic layers and at least one bonding layer, the at least one bonding layer bonding two respective magnetic layers; and a coil structure coupled with the magnetic stack;

wherein the magnet stack is embedded as an inlay within the base material stack, and wherein a stacking direction of the magnetic layers and the at least one bonding layer is parallel to a direction of a winding axis of the coil structure.

2. The component carrier according to claim 1, further comprising at least one of the following features:

wherein the at least one bonding layer is temperature-stable at least up to a temperature of 300° C.;

wherein the at least one bonding layer comprises or consists of epoxy resin;

wherein at least part of the magnetic layers is made of nanocrystalline magnetic material;

wherein at least part of the magnetic layers comprises an iron-silicon compound;

wherein at least part of the magnetic layers has a magnetic permeability of at least 10000.

3. The component carrier according to claim 1, further comprising at least one of the following features:

wherein the coil structure is arranged as a planar coil;

wherein the coil structure comprises a plurality of helical windings and/or a plurality of annular windings;

wherein the coil structure comprises or consists of copper and/or material of the at least one electrically conductive layer structure.

4. The component carrier according to claim 1, further comprising at least one of the following features:

at least one surface mounted component;

wherein a thickness of a respective one of the at least one bonding layer is in a range between 1 μm and 20 μm;

wherein a thickness of a respective one of the magnetic layers is in a range between 3 μm and 70 μm;

wherein an entire thickness of the magnet stack is in a range between 100 μm and 1 mm;

wherein the magnet stack is formed as an annulus;

wherein a dielectric disc is inserted as an inlay in a central through hole of the annulus;

wherein at least part of dielectric material in contact with at least part of the magnetic layers has a thermal conductivity of at least 1 W/mK;

wherein the magnet stack extends only along a sub-portion of a lateral and/or a vertical extension of the base material stack.

5. The component carrier according to claim 1, wherein the magnet stack has at least one gap.

6. The component carrier according to claim 5, wherein the at least one gap is filled with a dielectric solid material or is an air gap.

7. The component carrier according to claim 1, wherein the component carrier forms at least one of a group consisting of a wireless charger, an inductor, a transformer, and a power converter.

8. The component carrier according to claim 1, further comprising at least one of the following features:

at least one component surface mounted on and/or embedded in the base material stack, wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;

wherein the at least one electrically conductive layer structure comprises at least one of a group consisting of copper, aluminum, nickel, silver, gold, palladium, and tungsten;

wherein the at least one electrically insulating layer structure comprises at least one of a group consisting of resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide;

wherein the component carrier is shaped as a plate;

wherein the component carrier is configured as a laminate-type component carrier.

9. A method of manufacturing a component carrier, the method comprising:

providing a base material stack having electrically conductive layer structures and at least one electrically insulating layer structure;

embedding a magnet stack as an inlay within the base material stack; and coupling a coil structure with the magnetic stack, wherein the magnet stack includes at least two magnetic layers and at least one bonding layer in between bonding the at least two magnetic layers, wherein a stacking direction of the magnetic layers and the at least one bonding layer is parallel to a direction of a winding axis of the coil structure.

10. The method according to claim 9, wherein embedding the magnet stack includes placing the magnet stack in a cavity of the base material stack.

11. The method according to claim 9, wherein embedding the magnet stack includes placing the magnet stack in a through hole of the base material stack being temporarily closed by a temporary carrier.

12. The method according to claim 9, further comprising:

forming the magnet stack by adhering respective ones of the magnetic layers together by a respective one of the at least one bonding layer.

13. The method according to claim 9, further comprising:

forming the magnet stack by forming a plurality of double sheets, each formed by connecting a respective magnetic layer with a respective bonding layer at a temperature below a curing temperature of the bonding layer;

thereafter connecting the plurality of double sheets with each other at a temperature at or above the curing temperature of the bonding layers.

14. A method, comprising:

forming a printed circuit arranged as a base material stack having electrically conductive layer structures and at least one electrically insulating layer structure;

forming a magnetic stack as an alternating sequence of substantially planar magnetic layers and substantially planar dielectric bonding layers between each pair of adjacent magnetic layers, wherein the planar magnetic layers include a nanocrystalline magnetic material and each bonding layer is thermally stable at least up to 300° C., the magnetic stack having at least one bonding layer bonding two respective planar magnetic layers;

inserting the magnetic stack as an inlay for embedding into the printed circuit board; and coupling a coil structure with the magnetic stack;

wherein a stacking direction of the magnetic layers and the at least one bonding layer is parallel to a direction of a winding axis of the coil structure.

\* \* \* \* \*